(12) United States Patent
Carducci et al.

(10) Patent No.: US 8,440,019 B2
(45) Date of Patent: *May 14, 2013

(54) LOWER LINER WITH INTEGRATED FLOW EQUALIZER AND IMPROVED CONDUCTANCE

(75) Inventors: James D. Carducci, Sunnyvale, CA (US); Andrew Nguyen, San Jose, CA (US); Ajit Balakrishna, Sunnyvale, CA (US); Michael C. Kutney, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/607,425

(22) Filed: Sep. 7, 2012

(65) Prior Publication Data

US 2012/0325406 A1 Dec. 27, 2012

Related U.S. Application Data

(60) Continuation of application No. 13/401,572, filed on Feb. 21, 2012, now Pat. No. 8,282,736, which is a continuation of application No. 13/191,850, filed on Jul. 27, 2011, now Pat. No. 8,118,938, which is a division of application No. 12/099,007, filed on Apr. 7, 2008, now Pat. No. 7,987,814.

(51) Int. Cl.
*C23C 16/455* (2006.01)
*C23C 16/52* (2006.01)
*C23F 1/00* (2006.01)
*H01L 21/306* (2006.01)
*C23C 16/06* (2006.01)
*C23C 16/22* (2006.01)

(52) U.S. Cl.
USPC ........ 118/715; 118/728; 118/50; 156/345.34; 156/345.26; 156/345.51

(58) Field of Classification Search ................. 118/715, 118/728, 50; 156/345.34, 345.51, 345.26
See application file for complete search history.

(56) References Cited

U.S. PATENT DOCUMENTS

| 4,134,425 A |   | 1/1979  | Gussefeld et al. |
|-------------|---|---------|------------------|
| 5,322,567 A | * | 6/1994  | Deaton et al. ................. 118/715 |
| 5,366,585 A | * | 11/1994 | Robertson et al. .............. 216/67 |

(Continued)

FOREIGN PATENT DOCUMENTS

| JP | 2001179078 A | 7/2001 |
|----|--------------|--------|
| JP | 2002151471 A | 5/2002 |

(Continued)

OTHER PUBLICATIONS

PCT International Search Report and Written Opinion for Application No. PCT/US2009/039662 dated Nov. 24, 2009.

(Continued)

*Primary Examiner* — Rudy Zervigon
(74) *Attorney, Agent, or Firm* — Patterson & Sheridan, LLP

(57) ABSTRACT

A plasma processing chamber has a lower liner with an integrated flow equalizer. In an etching process, the processing gases may be unevenly drawn from the processing chamber which may cause an uneven etching of the substrate. The integrated flow equalizer is configured to equalize the flow of the processing gases evacuated from the chamber via the lower liner.

15 Claims, 3 Drawing Sheets

U.S. PATENT DOCUMENTS

| | | | |
|---|---|---|---|
| 5,788,799 A * | 8/1998 | Steger et al. | 156/345.37 |
| 5,885,356 A * | 3/1999 | Zhao et al. | 118/723 ER |
| 5,891,350 A * | 4/1999 | Shan et al. | 216/71 |
| 5,997,589 A | 12/1999 | Tien | |
| 6,095,083 A | 8/2000 | Rice et al. | |
| 6,120,605 A | 9/2000 | Sato | |
| 6,156,151 A | 12/2000 | Komino et al. | |
| 6,170,429 B1 * | 1/2001 | Schoepp et al. | 118/723 R |
| 6,176,969 B1 * | 1/2001 | Park et al. | 156/345.29 |
| 6,203,657 B1 * | 3/2001 | Collison et al. | 156/345.48 |
| 6,206,976 B1 | 3/2001 | Crevasse et al. | |
| 6,221,202 B1 * | 4/2001 | Walko, II | 156/345.43 |
| 6,245,190 B1 * | 6/2001 | Masuda et al. | 156/345.46 |
| 6,251,216 B1 * | 6/2001 | Okamura et al. | 156/345.1 |
| 6,261,408 B1 * | 7/2001 | Schneider et al. | 156/345.26 |
| 6,264,788 B1 * | 7/2001 | Tomoyasu et al. | 156/345.43 |
| 6,277,237 B1 * | 8/2001 | Schoepp et al. | 156/345.1 |
| 6,403,491 B1 * | 6/2002 | Liu et al. | 438/710 |
| 6,415,804 B1 * | 7/2002 | Pascal et al. | 134/182 |
| 6,428,662 B1 * | 8/2002 | Woodruff et al. | 204/275.1 |
| 6,527,911 B1 | 3/2003 | Yen et al. | |
| 6,531,069 B1 | 3/2003 | Srivastava et al. | |
| 6,692,649 B2 * | 2/2004 | Collison et al. | 216/67 |
| 6,726,801 B2 * | 4/2004 | Ahn | 156/345.29 |
| 6,733,620 B1 * | 5/2004 | Sugiyama et al. | 156/345.29 |
| 6,767,429 B2 | 7/2004 | Amano | |
| 6,827,815 B2 * | 12/2004 | Hytros et al. | 156/345.33 |
| 6,878,234 B2 * | 4/2005 | Ogasawara et al. | 156/345.29 |
| 6,963,043 B2 * | 11/2005 | Fink | 219/121.43 |
| 7,011,039 B1 * | 3/2006 | Mohn et al. | 118/723 R |
| 7,048,837 B2 | 5/2006 | Somekh et al. | 204/192.13 |
| 7,166,166 B2 * | 1/2007 | Saigusa et al. | 118/715 |
| 7,198,677 B2 | 4/2007 | Yoo | |
| 7,204,912 B2 * | 4/2007 | Saigusa et al. | 156/345.51 |
| 7,282,112 B2 * | 10/2007 | Nishimoto et al. | 156/345.29 |
| 7,291,566 B2 * | 11/2007 | Escher et al. | 438/758 |
| 7,416,635 B2 * | 8/2008 | Moriya et al. | 156/345.34 |
| 7,552,521 B2 * | 6/2009 | Fink | 29/557 |
| 7,560,083 B2 * | 7/2009 | Moriya et al. | 423/210 |
| 7,560,376 B2 * | 7/2009 | Escher et al. | 438/622 |
| 7,566,368 B2 * | 7/2009 | Saigusa et al. | 118/715 |
| 7,601,242 B2 * | 10/2009 | Fink | 156/345.51 |
| 7,648,610 B2 | 1/2010 | Komiya et al. | |
| 7,678,226 B2 * | 3/2010 | Saigusa et al. | 156/345.51 |
| 7,708,834 B2 * | 5/2010 | Horimizu | 118/715 |
| 7,749,326 B2 | 7/2010 | Kim et al. | |
| 7,762,114 B2 * | 7/2010 | Abney et al. | 72/84 |
| 7,811,428 B2 * | 10/2010 | Nishimoto et al. | 204/298.11 |
| 7,862,683 B2 * | 1/2011 | Fukiage | 156/345.35 |
| 7,879,179 B2 * | 2/2011 | Otsuki | 156/345.1 |
| 7,901,510 B2 * | 3/2011 | Horimizu | 118/715 |
| 7,910,218 B2 * | 3/2011 | Lin et al. | 428/469 |
| 7,987,814 B2 * | 8/2011 | Carducci et al. | 118/723 R |
| 8,021,743 B2 * | 9/2011 | Lin et al. | 428/220 |
| 8,118,938 B2 | 2/2012 | Carducci et al. | |
| 8,282,736 B2 | 10/2012 | Carducci et al. | |
| 2001/0023741 A1 * | 9/2001 | Collison et al. | 156/345 |
| 2001/0032591 A1 | 10/2001 | Carducci et al. | |
| 2001/0054381 A1 | 12/2001 | Umotoy et al. | |
| 2002/0069970 A1 * | 6/2002 | Noorbakhsh et al. | 156/345.37 |
| 2002/0134308 A1 | 9/2002 | Amano | |
| 2003/0038111 A1 | 2/2003 | Carducci et al. | |
| 2003/0092278 A1 * | 5/2003 | Fink | 438/710 |
| 2003/0094135 A1 * | 5/2003 | Komiya et al. | 118/715 |
| 2003/0192644 A1 | 10/2003 | Pu et al. | |
| 2003/0192646 A1 | 10/2003 | Wu et al. | |
| 2004/0040664 A1 | 3/2004 | Yang et al. | |
| 2004/0072426 A1 * | 4/2004 | Jung | 438/689 |
| 2004/0082251 A1 | 4/2004 | Bach et al. | |
| 2004/0129218 A1 | 7/2004 | Takahashi et al. | |
| 2004/0206309 A1 | 10/2004 | Bera et al. | |
| 2005/0121143 A1 | 6/2005 | Daugherty et al. | |
| 2005/0224180 A1 | 10/2005 | Bera et al. | |
| 2006/0000552 A1 * | 1/2006 | Tanaka et al. | 156/345.28 |
| 2006/0118042 A1 * | 6/2006 | Horimizu | 118/720 |
| 2006/0151114 A1 * | 7/2006 | Fink | 156/345.29 |
| 2006/0196604 A1 * | 9/2006 | Moriya et al. | 156/345.34 |
| 2007/0284043 A1 * | 12/2007 | Tanaka et al. | 156/345.28 |
| 2008/0035605 A1 | 2/2008 | Takahashi | |
| 2008/0090417 A1 | 4/2008 | De La Llera et al. | |
| 2008/0295964 A1 | 12/2008 | Takahashi | |
| 2009/0028761 A1 * | 1/2009 | Devine et al. | 422/186.04 |
| 2009/0188625 A1 | 7/2009 | Carducci et al. | |
| 2009/0236043 A1 * | 9/2009 | Matsudo et al. | 156/345.43 |
| 2010/0192354 A1 * | 8/2010 | Horimizu | 29/525.12 |

FOREIGN PATENT DOCUMENTS

| | | |
|---|---|---|
| JP | 2002533911 A | 10/2002 |
| JP | 2003505855 A | 2/2003 |
| JP | 2004342703 A | 12/2004 |
| JP | 2006186323 A | 7/2006 |
| JP | 2006269806 A | 10/2006 |
| WO | WO-00/19481 A2 | 4/2000 |
| WO | WO-00/19495 A2 | 4/2000 |

OTHER PUBLICATIONS

Notice of First Office Action dated Aug. 13, 2012 for Chinese Patent Application No. 200980112419.3.

Office Action dated Jan. 8, 2013 for Japanese Patent Application No. 2011-504110.

Office Action dated Feb. 4, 2013 for Korean Patent Application No. 10-2012-7028345.

* cited by examiner

LOWER LINER WITH INTEGRATED FLOW EQUALIZER AND IMPROVED CONDUCTANCE

CROSS-REFERENCE TO RELATED APPLICATIONS

This application is a continuation application of U.S. patent application Ser. No. 13/401,572, filed Feb. 21, 2012 now U.S. Pat. No. 8,282,736, which is a continuation application of U.S. patent application Ser. No. 13/191,850, filed on Jul. 27, 2011, now issued as U.S. Pat. No. 8,118,938, which is a divisional application of Ser. No. 12/099,007, filed on Apr. 7, 2008, now issued as U.S. Pat. No. 7,987,814, each of which is herein incorporated by reference.

BACKGROUND

1. Field

Embodiments of the present invention generally relate to a plasma processing chamber having a lower chamber liner.

2. Description of the Related Art

Modern integrated circuits are complex devices that may include millions of components on a single chip; however, the demand for faster, smaller electronic devices is ever increasing. This demand not only requires faster circuits, but it also requires greater circuit density on each chip. In order to achieve greater circuit density, minimal dimensions, or critical dimensions, of features of integrated circuit components must be reduced as well.

Reduction in the critical dimensions of integrated circuit component features requires strict process uniformity across a substrate in order to maintain high yields. One problem associated with conventional plasma etch processes used in manufacturing of integrated circuits is non-uniformity of an etch rate across the substrate. Such non-uniformity may be due, in part, to a vacuum pump drawing an etching gas toward an exhaust port provided in an etch chamber and away from the substrate. Since gases are more easily pumped away from areas of the chamber that are closest to the exhaust port, the etching gas is pulled toward the exhaust port and away from the substrate. This creates a non-uniform etch on the substrate positioned therein, which may significantly decrease the performance of the resulting integrated circuit and significantly increase the cost of fabrication.

Therefore, a need exists for an apparatus for uniformly etching material layers during the manufacture of integrated circuits.

SUMMARY

In one embodiment, an integrated flow equalizer is provided in a plasma processing chamber. The integrated flow equalizer may be configured to protect lower chamber walls from exposure to plasma and to allow improved gas flow conductance. A lower chamber liner may be elevated from a chamber bottom wall to create a high conductance plenum between the lower chamber liner and the bottom wall. The lower chamber liner may have an aperture formed therethrough configured to equalize the flow of processing gas drawn by a vacuum pump in fluid communication with the plenum resulting in uniform plasma flow and uniform etching across a substrate situated in the plasma processing chamber.

In one embodiment of the present invention, an annular chamber liner for a plasma chamber comprises a bottom wall and an outer wall sloping upwardly and outwardly from the bottom wall. The annular chamber liner has a plurality of slots extending through the outer wall. The plurality of slots are arranged such that at least one slot is present within each quadrant of the annular chamber liner.

In another embodiment of the present invention, an apparatus for plasma processing comprises a chamber body, a first chamber liner disposed within the chamber body, and a second chamber liner disposed within the chamber body below the first chamber liner and electrically coupled to the first chamber liner. The second chamber liner comprises a bottom wall and an outer wall sloping upwardly and outwardly from the bottom wall. The second chamber liner has a plurality of slots extending through the outer wall. The plurality of slots are arranged such that at least one slot is present within each quadrant of the second chamber liner.

In yet another embodiment of the present invention, a plasma processing apparatus comprises a chamber body, a substrate support pedestal disposed in the chamber body, a gas introduction showerhead disposed in the chamber opposite the substrate support, an upper chamber liner disposed in the chamber body such that the substrate support pedestal, the gas introduction showerhead, and the first chamber liner at least partially enclose a processing area, and a lower chamber liner disposed within the chamber body below the upper chamber liner and electrically coupled to the upper chamber liner. The lower chamber liner comprises a bottom wall and an outer wall sloping upwardly and outwardly from the bottom wall. The second chamber liner has a plurality of slots extending through the outer wall. The plurality of slots are arranged such that at least one slot is present within each quadrant of the second chamber liner.

BRIEF DESCRIPTION OF THE DRAWINGS

So that the manner in which the above recited features of the embodiments of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention generally comprise a plasma processing chamber having a lower chamber liner with an integrated flow equalizer. Various embodiments of the present invention will be described below in relation to an etching chamber. However, a variety of plasma deposition and etching chambers may benefit from the teachings disclosed herein, and in particular, dielectric etching chambers such as the ENABLER® etch chamber, which may be part of a semiconductor wafer processing system such as the CENTURA® system, the PRODUCER® etch chamber, the eMax® etch chamber, among others, all of which are available from Applied Materials, Inc. of Santa Clara, Calif. It is contemplated that other plasma reactors, including those from other manufacturers, may be adapted to benefit from the invention.

Figure 1:
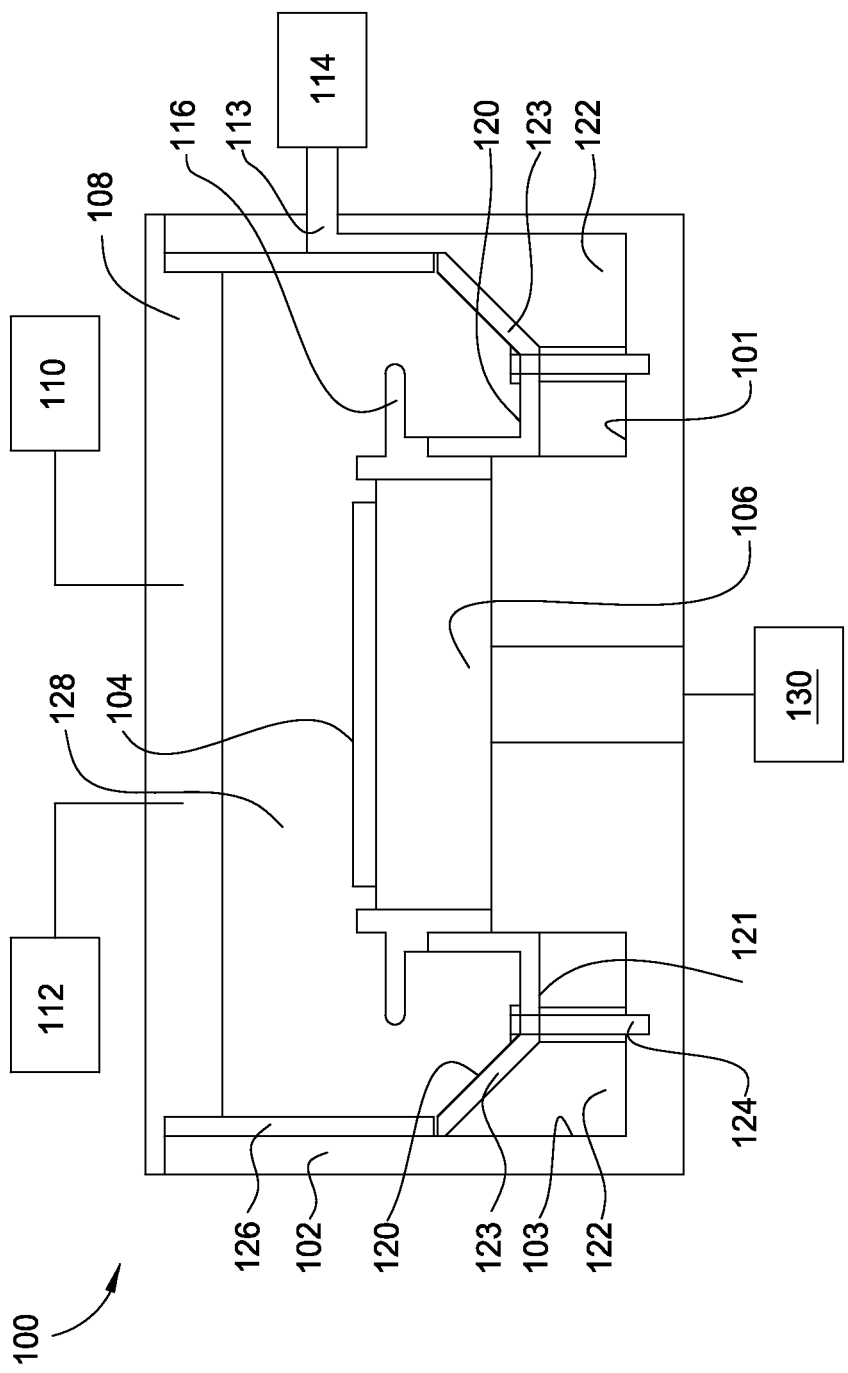
FIG. 1 is a schematic cross-sectional view of an etching apparatus according to one embodiment of the invention.

FIG. 1 is a schematic cross-sectional view of an etching apparatus 100 according to one embodiment of the present invention. The apparatus 100 comprises a chamber body 102 in which a substrate 104 may be disposed on a pedestal 106 opposite a gas introduction showerhead 108. Processing gas may be supplied to the chamber 102 through the showerhead 108. Processing gas may be supplied to the chamber 102 through the showerhead 108 from a gas source 110. In one embodiment, the pedestal 106 may be biased with current from a power source 130. In another embodiment, the showerhead 108 may be biased with a current from a power source 112.

During processing, the processing gas is supplied through the showerhead 108 into the processing area 128 where the processing gas, in plasma form, proceeds to etch material from the substrate 104. The plasma may extend not only to the substrate 104, but it may extend to the chamber walls as well. To protect the chamber walls from the plasma, an upper liner 126 may be present. The upper liner 126 may protect the chamber walls from exposure to the plasma. Additionally, the upper liner 126 may be removed during processing downtime to be cleaned or replaced.

An annular baffle 116 may surround the substrate 104 and the pedestal 106. The annular baffle 116 may extend close to the upper liner 126 and have a plurality of slots therethrough. The slots in the baffle 116 permit processing gas to be drawn therethrough to be evacuated out of the processing chamber body 102. The slots may be sized to eliminate or reduce the amount of plasma that passes through the baffle 116.

Processing gas may also be drawn around the baffle 116 in the area between the baffle 116 and the upper liner 126. Generally, most of the plasma is confined to the processing area 128, but some plasma may extend out beyond the outer diameter of the baffle 116 and be pulled below the baffle 116. A lower chamber liner 120 may be present to protect the lower chamber walls from the plasma. The lower liner 120 may be removed during processing downtime to be cleaned or replaced. The lower liner 120 may be coupled to the bottom of the chamber body 102 by a fastening mechanism 124. In one embodiment, the fastening mechanism 124 may comprise a screw. In one embodiment, the fastening mechanism 124 may be countersunk into the lower liner 120.

A vacuum pump 114 may evacuate the processing chamber body 102 and thus pull processing gases through the baffle 116 and through the area between the baffle 116 and the upper liner 126. The lower chamber liner 120 may be configured in an elevated position with respect to the bottom of the chamber body 102, such that a large plenum 122 may exist between the bottom surface 121 of the lower chamber liner 120 and the bottom surface 101 of the chamber body 102 around the entire periphery of the chamber body 102. Additionally, the lower chamber liner 120 may have an upwardly sloping outer wall 123, such that the plenum 122 extends upwardly around the entire periphery of the lower chamber liner 120 between the outer wall 123 of the lower chamber liner and the wall 103 of the chamber body 102. The lower chamber liner 120 may contain a plurality of apertures (not shown in FIG. 1) to equalize the flow of processing gas drawn therethrough. Example of suitable apertures can be seen in FIGS. 2B and 3. The large plenum 122 functions to broadly distribute the vacuum draw. In one embodiment, the greatest draw through the lower chamber liner 120 may be achieved in the area closest to the exhaust port 113 in the chamber body 102, which may lead to non-uniformity in the etch plasma across the substrate 104. In one embodiment, to further promote, a uniform vacuum draw of process gas across the annulus of the lower chamber liner 120, the size and positioning of the apertures in the lower chamber liner 120 may be arranged as described below with respect to FIGS. 2B, and 3.

In addition, the lower chamber liner 120 is electrically coupled to the upper chamber liner 126, both of which are grounded. When an RF plasma is present, the RF current seeking a return path to ground may travel along the upper liner 126 and/or the lower liner 120, whichever has the path of least resistance. Electrically coupling the lower chamber liner 120 to the upper chamber liner 126 provides substantial surface area for the RF current seeking a path to ground. As a result, plasma may extend more uniformly over the substrate 104 in the chamber 100, resulting in increased etching uniformity.

Figure 2A:
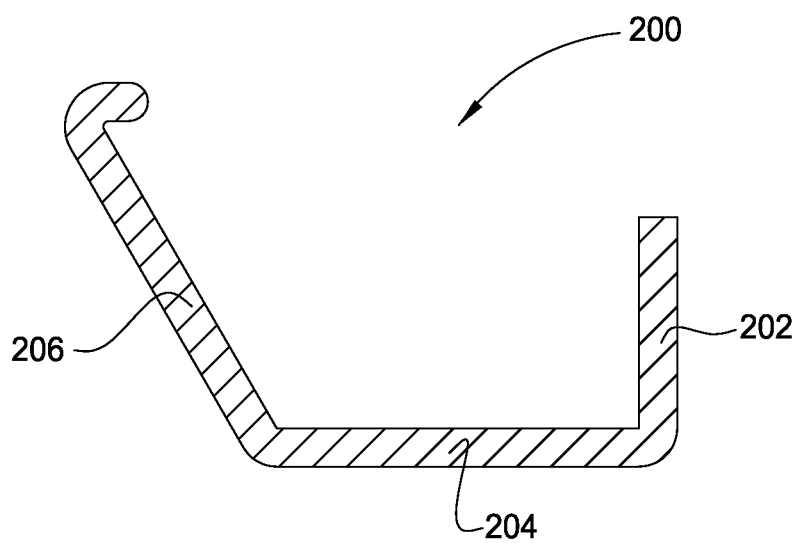
FIG. 2A is a partial, schematic cross-sectional view of a lower chamber liner with an integrated flow equalizer according to one embodiment of the invention.

FIG. 2A is a schematic, partial cross-sectional view of a lower chamber liner 200 according to one embodiment of the present invention. The lower liner comprises an inner wall 202 that extends up from the bottom wall 204. The inner wall 202 protects the area under the pedestal from plasma exposure. The outer wall 206 is upwardly sloping from the bottom wall 204 to the outer periphery of the lower chamber liner 200. A plurality of gas passages 208 extend across and through the outer wall 206 and the bottom wall 204 as depicted in FIGS. 2B and 3 and described below.

Figure 2B:
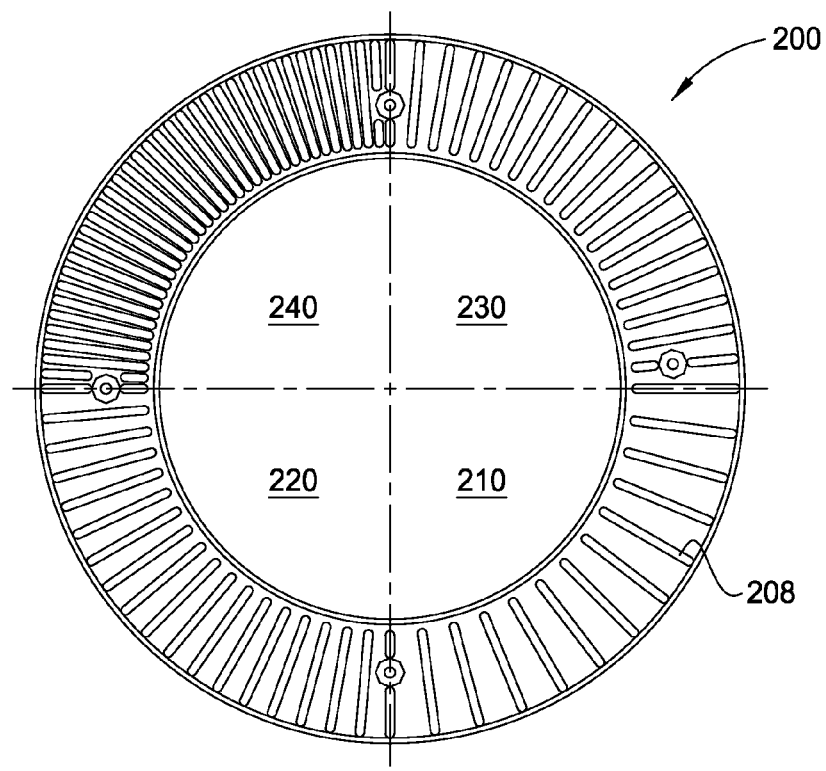
FIG. 2B is a schematic bottom view of the chamber liner in FIG. 2A.

FIG. 2B is a schematic bottom view of a lower chamber liner 200 of FIG. 2A. As shown in FIG. 2B, the gas passages 208 in the bottom wall 204 and the side wall 206 are broadly spaced apart in a first quadrant 210, which is to be positioned adjacent the exhaust port 113 in the chamber body 102. The gas passages 208 may be more narrowly spaced in a second quadrant 220 and a third quadrant 230 extending away from the first quadrant 210 of the lower chamber liner 200. In one embodiment, the spacing of the gas passages 208 may decrease across the second quadrant 220 and the third quadrant 230 extending away from the first quadrant 210. In another embodiment, the gas passages may be equally spaced across the second quadrant 220 and the third quadrant 230. The gas passages 208 are most narrowly spaced across the fourth quadrant 240, which is to be positioned farthest from the exhaust port 113 of the chamber body 102.

Figure 3:
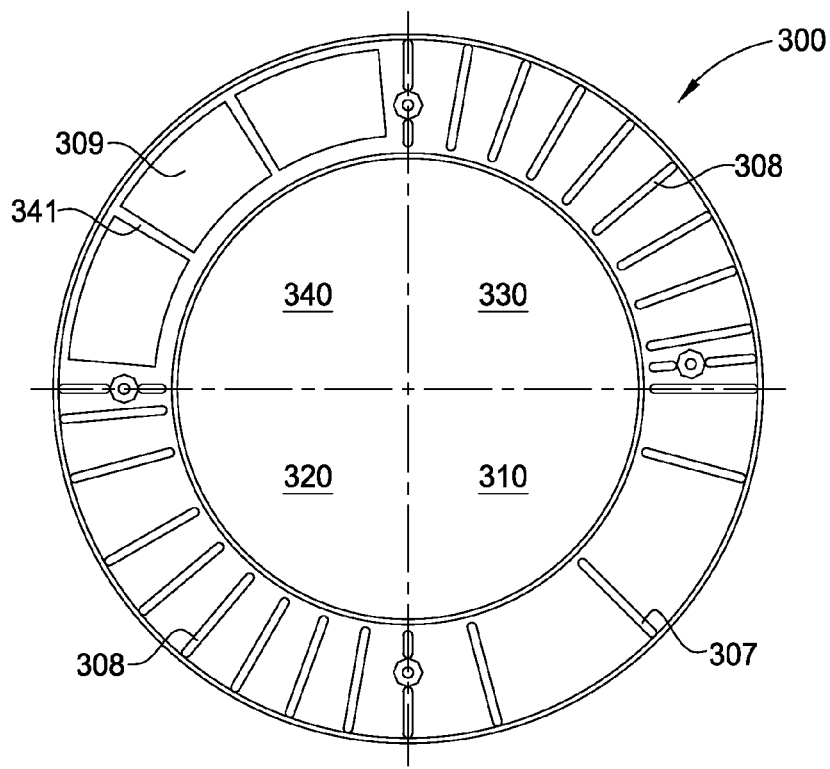
FIG. 3 is a schematic bottom view of another embodiment of the lower chamber liner of the present invention.

FIG. 3 is a schematic bottom view of a lower chamber liner 300 according to another embodiment of the present invention. In this embodiment, thin gas passages 307 are broadly spaced across the first quadrant 310 of the chamber liner 300, which is to be positioned adjacent the exhaust port 113 in the chamber body 102. Mid-sized gas passages 308, which are larger than the thin gas passages 307, are positioned more narrowly across the second quadrant 320 and the third quadrant 330 extending away from the first quadrant 310. Large gas passages 309, which are larger than the mid-sized gas passages 308, are positioned across the fourth quadrant 340 of the lower chamber liner 120, which is to be positioned farthest from the exhaust port 113 of chamber body 102. The large gas passages 309 are separated by thin, structural ribs. In one embodiment, a single gas passage 309 extends across the entire fourth quadrant 340. In another embodiment, the fourth quadrant 340 is divided into two gas passages 309 having a single structural rib 341 therebetween.

By configuring the gas passages 208, 307-309 extending through the lower chamber liner 120, 200, 300 such that the area farthest from the exhaust port 113 of the chamber 100 has the largest opening and the area adjacent the exhaust port 113 has the smallest area, the uniformity of vacuum draw from the processing area 128 may be increased. Correspondingly, by evening out the vacuum draw from the processing area 128, the plasma distribution, and ultimately, etching uniformity may be increased as well.

While the foregoing is directed to embodiments of the present invention, other and further embodiments of the invention may be devised without departing from the basic scope thereof, and the scope thereof is determined by the claims that follow.

The invention claimed is:

1. An annular chamber liner for a plasma chamber, comprising:
 a bottom wall; and
 an outer wall sloping upwardly and outwardly from the bottom wall,
 wherein the annular chamber liner has a plurality of slots extending through the outer wall, and wherein the plurality of slots are arranged such that at least one slot is present within each quadrant of the annular chamber liner.

2. The annular chamber liner of claim 1, wherein the plurality of slots are separated by a plurality of structural ribs.

3. The annular chamber liner of claim 1, wherein a periphery of the outer wall is configured for coupling with an upper chamber liner.

4. The annular chamber liner of claim 3, wherein the periphery of the outer wall is configured for electrically coupling with the upper chamber liner.

5. The annular chamber liner of claim 1, wherein the bottom wall is configured for coupling with a body of the plasma chamber.

6. The annular chamber liner of claim 1, wherein the plurality of slots are configured for drawing processing gases therethrough.

7. An apparatus for plasma processing, comprising:
 a chamber body;
 a first chamber liner disposed within the chamber body; and
 a second chamber liner disposed within the chamber body below the first chamber liner and electrically coupled to the first chamber liner, wherein the second chamber liner comprises:
  a bottom wall; and
  an outer wall sloping upwardly and outwardly from the bottom wall, wherein the second chamber liner has a plurality of slots extending through the outer wall, and wherein the plurality of slots are arranged such that at least one slot is present within each quadrant of the second chamber liner.

8. The apparatus of claim 7, wherein the second chamber liner is positioned such that an annular plenum is defined between the outer wall of the second chamber liner and the chamber body.

9. The apparatus of claim 7, wherein the annular plenum is in fluid communication with an exhaust port and the plurality of slots.

10. The apparatus of claim 7, wherein the bottom wall is coupled to a bottom wall of the chamber body.

11. A plasma processing apparatus, comprising:
 a chamber body;
 a substrate support pedestal disposed in the chamber body;
 a gas introduction showerhead disposed in the chamber opposite the substrate support;
 an upper chamber liner disposed in the chamber body such that the substrate support pedestal, the gas introduction showerhead, and the first chamber liner at least partially enclose a processing area; and
 a lower chamber liner disposed within the chamber body below the upper chamber liner and electrically coupled to the upper chamber liner, wherein the lower chamber liner comprises:
  a bottom wall; and
  an outer wall sloping upwardly and outwardly from the bottom wall, wherein the second chamber liner has a plurality of slots extending through the outer wall, and wherein the plurality of slots are arranged such that at least one slot is present within each quadrant of the second chamber liner.

12. The apparatus of claim 11, wherein the lower chamber liner is positioned such that an annular plenum is defined between the outer wall of the lower chamber liner and the chamber body.

13. The apparatus of claim 12, wherein the annular plenum is in fluid communication with an exhaust port and the plurality of slots.

14. The apparatus of claim 11, further comprising an annular baffle disposed around the substrate support pedestal.

15. The apparatus of claim 11, wherein the lower chamber liner is coupled to the chamber body.

* * * * *